United States Patent
Schneidewind et al.

(10) Patent No.: US 7,057,408 B2
(45) Date of Patent: Jun. 6, 2006

(54) METHOD AND PROBER FOR CONTACTING A CONTACT AREA WITH A CONTACT TIP

(75) Inventors: Stefan Schneidewind, Moritzburg OT Reichenberg (DE); Claus Dietrich, Thiendorf OT Sacka (DE); Jörg Kiesewetter, Dresden (DE); Stojan Kanev, Wiesenweg (DE); Stefan Kreissig, Venusberg (DE); Frank Fehrmann, Priestewitz OT Basslitz (DE); Hans-Jürgen Fleischer, Priestewitz (DE)

(73) Assignee: SUSS MicroTec Test Systems (GmbH), Dresden (DE)

( * ) Notice: Subject to any disclaimer, the term of this patent is extended or adjusted under 35 U.S.C. 154(b) by 0 days.

(21) Appl. No.: 10/879,622

(22) Filed: Jun. 29, 2004

(65) Prior Publication Data

US 2005/0007135 A1  Jan. 13, 2005

(30) Foreign Application Priority Data

Jul. 1, 2003 (DE) ................................ 103 29 792

(51) Int. Cl.
*G01R 31/02* (2006.01)
(52) U.S. Cl. .................................... 324/757
(58) Field of Classification Search ........ 324/757–758; 382/151; 356/243.1; 348/87; 33/645
See application file for complete search history.

(56) References Cited

U.S. PATENT DOCUMENTS 3,996,517 A * 12/1976 Fergason et al. ............ 324/754
4,864,227 A *  9/1989 Sato .......................... 324/758
4,992,659 A *  2/1991 Abraham et al. ........... 250/306
5,644,245 A *  7/1997 Saitoh et al. ............... 324/754

FOREIGN PATENT DOCUMENTS

JP          405121498 A *  5/1993

* cited by examiner

*Primary Examiner*—Vinh P. Nguyen
(74) *Attorney, Agent, or Firm*—Baker Botts LLP; Manu J. Tejwani

(57) ABSTRACT

A method of contacting a contact area with the tip of a contact needle (contact tip) in a prober and the arrangement of such a prober, is based on the object of ensuring reliable contacting and direct observation of the establishment of the contact between the contact tip and the contact area when contacting contact pads of small dimensions. The prober substantially includes a base frame with a movement device including a clamping fixture for receiving a semiconductor wafer and also contact needles, which are arranged opposite the free surface of the semiconductor wafer. The contacting of the contact tips initially requires a horizontal positioning of the semiconductor wafer, so that the contact area and the contact tip are one above the other and at a distance from each other, and subsequently moving vertically in the direction of the contact tip, until a contact of the contact tips with the contact area is established. The object is achieved by the vertical movement of the semiconductor wafer until the end position is reached being directly observed in a horizontal direction of observation and, for this purpose, an observation device is arranged in such a way that the observation axis runs in the spacing above the free wafer surface.

13 Claims, 1 Drawing Sheet

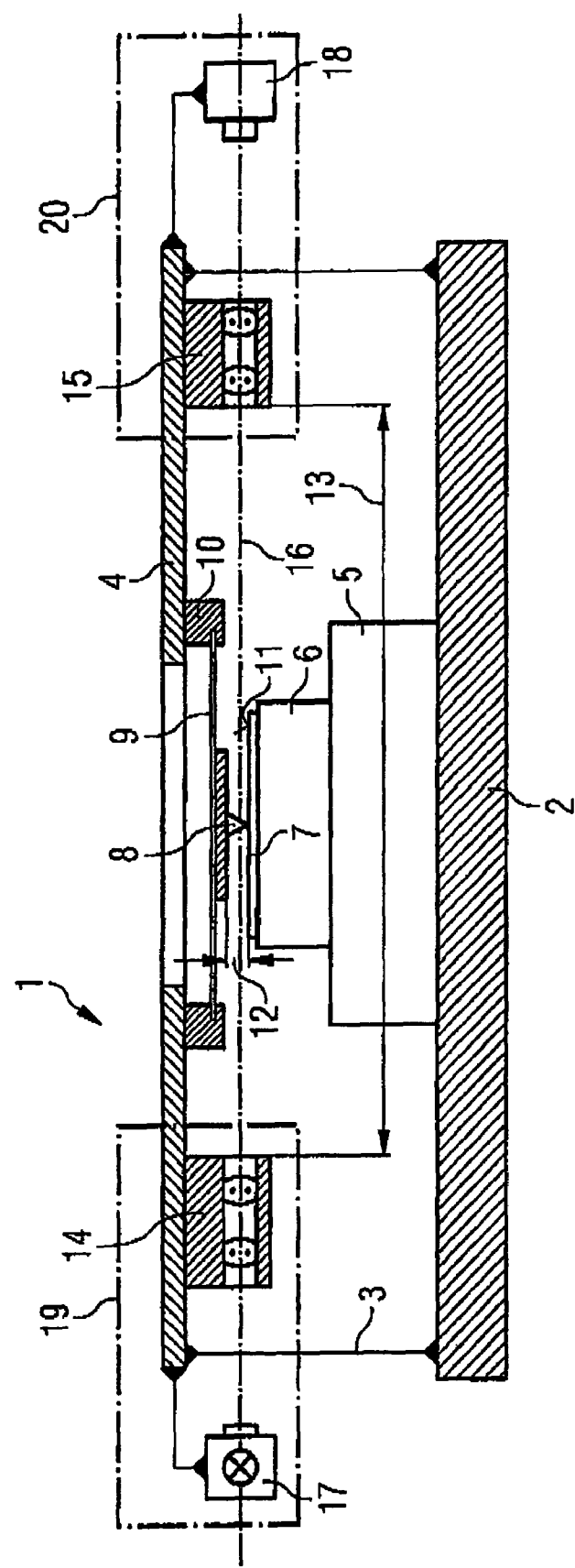

METHOD AND PROBER FOR CONTACTING A CONTACT AREA WITH A CONTACT TIP

The invention relates to a method of contacting a contact area with the tip of a contact needle (contact tip) in a prober, the contact area being arranged on the free wafer surface of a planar semiconductor wafer, in that the semiconductor wafer is initially positioned horizontally by means of a movement device in such a way that the contact area and the contact tip are one above the other and at a distance from each other and is subsequently made to move vertically in the direction of the contact tip, until a contact of the contact tip with the contact area is established.

The invention also relates to a prober with a base frame, to which a clamping fixture is connected by means of a movement device and onto which a planar semiconductor wafer can be clamped while leaving a free wafer surface exposed. The clamping fixture can be made to move in a vertical z direction and in a horizontal x direction and in a horizontal y direction perpendicular thereto. The prober is also provided with contact needles, which are arranged opposite the free wafer surface, and are held in one or more holding fixtures. The latter are at a distance from the free wafer surface and are connected to the one probe holding plate, which for its part is arranged over the clamping fixture and is connected to the base frame.

The increasing miniaturization of semiconductor circuits is accompanied by a reduction in the pad area of contact areas (contact pads), which serve either for making contact for test purposes and/or for producing bonding contacts.

If such contact pads are made to contact contact needles of probers over a small pad area, it may happen that a contact tip slips from the contact pad and consequently a faulty contact occurs. The reason for this is as follows:

Contact needles of probers are fastened either on probe holders or on probe cards. In the case of the use of probe holders, the probe holders are positioned on a probe holder plate in such a way that the contact tips are opposite the contact pads in a way corresponding to the pattern which the contact pads assume.

In the case of the use of probe cards, the contact needles are fastened on these very probe cards in such a way that the contact tips of the contact needles are likewise opposite the contact pads in the form of the pattern assumed by these contact pads.

Contact tips pre-positioned in this way are then brought into connection with the contact pads of the semiconductor chips generally by the semiconductor chips joined together with the semiconductor wafer, which is held on a clamping plate known as a chuck, being brought up against the contact tips from below, i.e. the chuck is moved vertically, after positioning in directions parallel to the plane of the semiconductor wafer. To compensate for the tolerances of the vertical moving path and to ensure that a contact is reliably established, the contact needles are made to be flexible and the operation is performed in a so-called overdrive, a movement beyond the minimum position required for contacting. As a result of this overdrive, the contact needles are elastically deformed, a lateral movement of the contact tip occurring in relation to the surface of the semiconductor. This is usually referred to as scratch. This scratch may be of such a size that the relative movement makes the contact tip slip from the contact pad, and the contacting is consequently lost.

To establish the required minimum position and the overdrive, the moving path of the chuck, in particular in the direction of the contact tips, is determined by means of the relative positional determination allowed by the movement device itself. If the measuring conditions allow, an observation of the contact tip in an observation axis which lies parallel to the moving path of the chuck to the contact tip, that is to say generally in the vertical direction, is additionally possible. Consequently, the movement of the contact pad that actually takes place in the direction of the contact needle can only be determined within those tolerances in which the movement device itself functions and additionally—if possible—visually only by means of the observation of the scratch.

On account of the miniaturization of the contact pads, however, these possibilities are not adequate to achieve an end position of the contact needle with reliable contact on the contact pad and at the same time with such little overdrive that the contact needle is certain not to slide off the contact pad.

If measurement of the scratch is possible at all, it proves to be unsuitable for establishing the optimum end position, since it is only ever a fraction of the actual movement of the contact pad taking place in the direction of observation, a fraction which is dependent on the angular position of the contact needle, that corresponds to the scratch observed, and consequently, given the present contact pad dimensions, there are orders of magnitude for the control of the movement that lie in the range of the dimensional and temporal tolerances of the observation and movement devices.

It is consequently the object of the invention to design a prober in such a way that, when contacting contact pads with small dimensions, it is possible to ensure reliable contacting with minimal overdrive. Furthermore, it is an object of the invention to present a method of contacting a contact area with a contact tip in this prober which allows direct observation of the establishment of the contact between the contact tip and the contact area.

On the method side, the object is achieved in that, during the vertical movement of the semiconductor wafer, the contact tip is observed along at least a substantially horizontal observation axis. According to the invention, the observation axis runs in a plane which is at a distance from the free wafer surface in its expected end position and the actual end position of the vertical movement is determined on the basis of the vertical deflection of the contact tip observed in this way. The substantially horizontal observation axis in this case also includes that the observation axis may be inclined at a shallow angle with respect to the free wafer surface, for example when focusing on the contact tip occurs.

On account of this direction of the observation axis, the decisive vertical movement which ultimately establishes the contact and the vertical deflection of the contact tip after it is set down on the contact area can be observed directly. From the knowledge of the angular position of the contact tip in relation to the contact area, it is possible for example to determine computationally the optimum vertical deflection of the contact tip from its position of rest, which corresponds to the optimum end position, that is to say in which a reliable contact is ensured and at the same time sliding of the contact needle off the contact area is avoided with certainty. Consequently, the actual deflection until the optimum end position is reached can be continuously observed during the vertical movement of the semiconductor wafer.

With the exact horizontal positioning of the contact area in relation to the contact tip previously performed, so that then only the movement in one direction, usually the vertical direction, is required to establish the contact, it is also only this vertical movement that is then decisive for the further contacting method.

The relative sizes described of the contact area and the resultant possible vertical deflection give rise to a very small tolerance range for reaching the end position, so that constant observation of the movement is required, in particular close to the expected end position. For this reason, the observation takes place along an axis which runs above the free surface of the semiconductor wafer in its expected end position, and consequently above the contact tip. It therefore proves to be particularly advantageous if this distance between the observation axis and the free wafer surface is very small, in particular of the order of magnitude of 100 microns, and the observation axis runs substantially parallel to the wafer surface. The expected end position can in this case be determined with sufficient accuracy from the dimensions of the prober, of the semiconductor wafer and of the contact needles and from the possibly required overdrive, and be fixed with respect to the set position of the contact needles or some other suitable common reference point.

If, in a way corresponding to a further refinement of the invention, the contact tip is observed against backlighting of an illuminating device, the contact tip and the contact area can be observed with exceptionally high contrast close to the end position.

The position according to the invention of the observation axis above the free wafer surface and the optical properties of the semiconductor wafer allow a mirror image of the contact tip, which is produced by the free wafer surface of the semiconductor wafer, to be observed in a particularly advantageous way during the vertical movement of the semiconductor wafer just before reaching the end position. During the vertical movement of the semiconductor wafer, the contact tip and its mirror image move towards each other and arrive in the position of apparent contact when the contact tip is set down on the wafer surface, that is to say when the end position is reached.

Given the stated small distance of the observation axis above the free wafer surface, the mirror image of the contact tip can only be observed when it is close to the expected end position, but in particular a very sharply contoured imaging is possible as a result.

In a way corresponding to a particularly advantageous refinement of the invention, the described possibilities for determining the end position, determining the vertical extent of the contact tip and determining the apparent contact between the contact tip and its mirror image are combined with one another, in that the end position of the vertical movement of the semiconductor wafer is determined from the position at the time of apparent contact of the contact needle with its mirror image and the then following vertical deflection of the contact tip. In this way, the overdrive for ensuring reliable contact can be set very accurately, for example even under defined thermal conditions and spatial conditions which have changed because of the different thermal expansion of the different materials.

Since the observation of the movement of an object in a defined direction can be followed particularly exactly from two directions which are substantially at right angles to each other and are in turn at right angles to the direction of movement, it is of advantage if, in a refinement of the invention, the observation takes place along two observation axes which are aligned substantially at right angles to each other in one plane.

In principle, the direction of observation with respect to the alignment of the contact needles, for example for the observation of the mirror image, can be freely selected, but it proves to be of advantage, for example given a very acute angle between the contact needle and the free wafer surface or given different tip geometries, if the observation axis runs at right angles to the alignment of the contact needle, in order to produce a mirror image with a clearly identifiable tip. Furthermore, the observation of the vertical deflection of the contact tip can be observed particularly well if the observation takes place at right angles to the alignment of the contact needle. With the two possible directions of observation, it is possible to conform flexibly to the respective constellations with regard to the contact needle geometry, the required accuracy in the setting of the end position or the other spatial conditions.

For this reason, it is likewise helpful that the execution of the contacting of the contact area is observed in plan view. In this way it is possible if appropriate to observe a scratch in the known way, and similarly a drift of the contact area in the horizontal direction in the course of its vertical movement.

This object is achieved on the arrangement side according to the invention by an observation device with an observation axis being arranged in such a way that the observation axis runs in the spacing between the free wafer surface and the holding fixture or fixtures.

By means of these observation devices, the contact needles can be subjected to precise observation during the contacting of the contact pads. It is consequently possible for example to determine precisely the amount of overdrive achieved and, in the case of a fixed amount, set the vertical movement.

It is expedient in this respect that the observation axis runs substantially horizontally and parallel to the free wafer surface. This achieves the effect that the holding fixtures or other components do not hinder the view of the contact needles.

In one configuration, it is provided that an illuminating device with an illuminating axis is arranged opposite the observation device in such a way that the illuminating axis and the observation axis lie on a common optical axis which runs through the spacing between the free wafer surface and the holding fixture or fixtures. Consequently, the observation device operates on the backlighting principle, whereby sharp-contoured imaging of the contact needles can be achieved.

In principle, it is possible to set and keep the contact needles in their position by means of single probe holders. In particular in the case of productive probers, however, it is expedient that a probe card, on one side of which the contact needles are arranged and are connected to the probe holder plate by means of a probe card holder, is used as the holding fixture for the contact needles and the optical axis runs between the contact needles side and the wafer surface.

In a further embodiment of the invention, it is provided that the observation device comprises an observation means and an observation lens and the illuminating device comprises a light source and illuminating optics. At least the observation lens and the illuminating optics are arranged underneath the probe holder plate and are connected to it. They are at a distance from each other allowing the movement of the clamping fixture. It is consequently ensured that the clamping fixture can be made to move in such a way that each point of the semiconductor wafer can be contacted.

In a further embodiment, so-called Koehler illumination is realized by the focus of the illuminating optics and the focus of the observation lens lying in the region of the contact needles, whereby particularly sharp and high-contrast imaging is made possible.

For simple and convenient handling and for further use of the observation results for regulating or automatically controlling the movement device for example, it is expedient that a CCD camera is used as the observation means.

The invention is to be explained in more detail below on the basis of an exemplary embodiment. The associated drawing shows a basic representation of a prober in a sectional representation.

The prober 1 has a base frame 2, on which a probe holder plate 4 is fastened and arranged at a distance by means of a mounting support 3.

Connected to the base frame 2 underneath the probe holder plate 4 is a movement device 5, which is designed such that it is movable in a horizontal x direction, a horizontal y direction perpendicular thereto and a vertical z direction and is rotatable about a vertical axis of rotation by an angle φ.

Arranged on this movement device 5 is a clamping fixture 6, which can be guided by the movements of the movement device 5.

A semiconductor wafer 7 which is provided with a number of contact areas in the form of contact pads (not represented in any more detail) is placed onto the clamping fixture 6 for testing. For contacting these contact pads, a contact needle 8 which is arranged on a probe card 9 is provided. The probe card 9 is fastened by means of a probe card holder 10 on the underside of the probe holder plate 4. The contact needle 8 is then directed downwards and contacts the contact pad on the upwardly directed free wafer surface 11 of the semiconductor wafer 7. Provided between the probe card 9 and the free wafer surface 11 is a spacing 12, which is bridged by the contact needle 8 in that position of the semiconductor wafer 7 in which the contact between the contact needle 8 and the contact pad is established.

In the schematic representation of the prober 1, only one contact needle 8 is considered, but it is also conceivable to arrange a number of contact needles 8, which are arranged in precisely the same pattern as the contact pads on the semiconductor wafer 7. In this case, the contact needles 8 contact a number of contact pads simultaneously, only one contact tip having to be observed to establish the contact, because all the tips of the contact needles 8 (contact tips) coincide in their vertical arrangement.

In principle, the invention is also not restricted to the contacting represented of the semiconductor wafer 7. For example, underside contacting is also possible if the free wafer surface 11 is directed downwards and the contact needles 8 are directed upwards, in order for example to perform backside observation of the semiconductor wafer 7. In the exemplary embodiment, however, only contacting from above is represented.

To the sides of the probe card holders 10 and at a distance 13 from each other, which allows the clamping fixture 6 to be made to move to the extent that every point on the free wafer surface 11 can be contacted, there are illuminating optics 14 and an observation lens 15 fastened on the underside of the probe holder plate 4. The illuminating optics 14 have an illuminating axis and the observation lens 15 has an observation axis, which both lie on a common optical axis 16 which runs through the region of the contact needles 8.

A light source 17 is arranged on the side of the illuminating optics 14 facing away from the contact needles 8, and a CCD camera 18 is arranged as observation means on the side of the observation lens 15 facing away from the contact needles 8. The light source 17 and the illuminating optics 14 in this case form an illuminating device 19, and the observation lens 15 and the CCD camera 18 form an observation device 20. In this case, the illuminating optics 14 are set in such a way that the focus of the illuminating device 19 lies in the region of the contact needles 8. In the same way, the observation lens 15 is set in such a way that the focus of the observation device 20 lies in the region of the contact needles 8. With this arrangement of the illuminating device 19 and the observation device 20, it is possible to observe the contact needles 8 with backlighting.

For the contacting, the semiconductor wafer 7 is initially aligned horizontally in such a way that the contact pad to be contacted is located exactly centrally and vertically under the tip of the contact needle 8 at a distance from the tip. This horizontal alignment preferably takes place in a position of the clamping fixture 6 that is remote from the measuring position and is consequently easily accessible, in that the position of the tip of the contact needle 8 is exactly set with respect to a fixed reference point plus a distance exactly defined in the x and y directions for the centre point of the contact pad, with respect to the same reference point, and subsequently this distance is reduced to zero by means of the movement device 5.

Following this, the semiconductor wafer 7 is pre-positioned vertically by means of the movement device 5 apart from a small distance between the contact pad and the contact tip. Starting from this position of the contact pad, the contact is established by the further vertical movement of the semiconductor wafer 7, performed by means of fine advancement.

The observation of the contact needle takes place during this vertical movement of the semiconductor wafer 7 shortly before the contacting and during the contacting of the contact needle 8 on the contact pad. As this happens, the semiconductor wafer 7, which is securely clamped on the clamping fixture 6, is brought up against the contact needles 8 from below by means of the movement device 5. As soon as the semiconductor wafer is in the direct vicinity of the contact tip, the mirror image of the contact tip becomes visible and the two move towards each other. When the mirror image and the image of the contact needle coincide, there is only a minimal distance of a few micrometres between the contact needle 8 and the contact pad, or the contact needle meets the contact pad. After setting down, the contact needle begins to deform elastically. This deformation can be registered by means of the CCD camera 18. When there is a certain degree of deformation, the z movement for example can be stopped. In this way it is ensured that the overdrive does not lead to the contact needle 8 sliding off the contact pad.

LIST OF REFERENCE NUMERALS 1 prober
2 base frame
3 mounting support
4 probe holder plate
5 movement device
6 clamping fixture
7 semiconductor wafer
8 needles
9 probe card
10 probe card holder
11 free wafer surface
12 spacing
13 distance
14 illuminating optics 15 observation lens
16 optical axis
17 light source
18 CCD camera
19 illuminating device
20 observation device

The invention claimed is:

1. A method of contacting a contact area with a contact needle or tip in a prober that is deployed for semiconductor wafer or device testing, the contact area being arranged on a free surface of a test semiconductor wafer, the method comprising the steps of:

first, positioning the test semiconductor wafer horizontally so that the contact area and the contact needle or tip are aligned one above the other and at a distance from each other;

then, moving the test semiconductor wafer vertically in the direction of the contact tip to an ending position at which a contact of the contact needle or tip with the contact area is established by direct observation of the vertical spacing between the contact area and the contact needle or tip wherein the latter step comprises:

directly observing the contact needle or tip along a horizontal observation axis in a plane which is at a distance from an expected end position of the free surface of the test semiconductor wafer; and determining the actual ending position of the free surface of the test semiconductor wafer based on an observed vertical deflection of the contact needle or tip.

2. The method of claim 1 wherein the horizontal observation axis lies in a plane which substantially parallel to and is at a distance of about 100 microns from the expected end position of the free surface of the test semiconductor wafer.

3. The method of claim 1 wherein observing the contact needle or tip along a horizontal observation axis in a plane which is at a distance from an expected end position of the free surface of the test semiconductor wafer comprises backlighting the contact needle or tip.

4. The method of claim 1 wherein observing the contact needle or tip along a horizontal observation axis in a plane which is at a distance from an expected end position of the free surface of the test semiconductor wafer comprises observing the contact needle or tip and its mirror image in the free wafer surface of the semiconductor wafer and wherein the vertical movement is ended at the earliest at the point in time at which an apparent contact of the contact tip with its mirror image is established.

5. The method of claim 4 further characterized in that the end position of the vertical movement of the semiconductor wafer is determined from the time of the apparent contact of the contact needle with its mirror image and the then following vertical deflection of the contact tip.

6. The method of claim 1 wherein observing the contact needle or tip along a horizontal observation axis in a plane which is at a distance from an expected end position of the free surface of the test semiconductor wafer further comprises observing the contact needle or tip along two observation axes that are aligned substantially at right angles to each other in the plane.

7. The method of claim 1 further comprising observing the contacting of the contact area in plan view.

8. A prober comprising:

a base frame to which a clamping fixture onto which a semiconductor wafer can be clamped while leaving a free wafer surface exposed;

a movement device coupled to the clamping fixture whereby the clamping fixture is movable in a vertical z direction and in horizontal x and y directions;

a contact needle or tip arranged opposite the free wafer surface, wherein the contact needle or tip is held in an holding fixture disposed at a distance from the free wafer surface, and wherein the contact needle or tip is connected to a probe holding plate that is arranged above the clamping fixture and is connected to the base frame;

an observation device having an observation axis that runs in the spacing between the free wafer surface and the holding fixture; and an illuminating device with an illuminating axis, wherein the illuminating device is arranged opposite the observation device so that the illuminating axis and the observation axis lie on a common optical axis which runs through the spacing between the free wafer surface and the holding fixture, wherein the observation device comprises an observation means and an observation lens and the illuminating device comprises a light source and illuminating optics, and wherein at least the observation lens and the illuminating optics are attached to the probe holder plate so that direct observation of the vertical distance of contact needle or tip and the contact area is not susceptible to vibrations relative to the base frame and so that the contact can be established by direct observation of the vertical spacing between the contact area and the contact needle or tip.

9. The prober of claim 8 wherein the observation axis is substantially horizontal and parallel to the free wafer surface.

10. The prober of claim 9 wherein the observation axis runs at or slightly above the vertical level of the contact needle or tip.

11. The prober of claim 9 wherein the contact needle is disposed on one side of a probe card and is connected to the probe holder plate by means of a probe card holder.

12. The prober of claim 8 wherein the focus of the illuminating optics and a focus of the observation lens lie in the region of the contact needle or tip.

13. The prober of claim 8 wherein the observation device comprises a CCD camera.

* * * * *